US006912070B1

United States Patent
Govindaswamy et al.

(10) Patent No.: US 6,912,070 B1
(45) Date of Patent: Jun. 28, 2005

(54) SUB-OPTIMAL VARIABLE LENGTH CODING

(75) Inventors: Senthil Govindaswamy, San Diego, CA (US); A. Chris Irvine, Bonsall, CA (US); Jeff Levin, San Diego, CA (US)

(73) Assignee: Qualcomm, Inc., San Diego, CA (US)

( * ) Notice: Subject to any disclaimer, the term of this patent is extended or adjusted under 35 U.S.C. 154(b) by 998 days.

(21) Appl. No.: 09/634,666

(22) Filed: Aug. 8, 2000

(51) Int. Cl.$^7$ .............................................. H04N 1/327
(52) U.S. Cl. ...................... 358/261.1; 358/467; 341/67; 341/106
(58) Field of Search .............................. 358/261.1, 474, 358/467, 426.01, 539, 426.06, 426.07, 426.11, 323; 341/67, 106, 51, 65, 55, 9, 63, 59; 382/232, 245, 246, 239; 704/503; 714/759

(56) References Cited

U.S. PATENT DOCUMENTS

| | | |
|---|---|---|
| 4,813,056 A | 3/1989 | Fedele |
| 5,021,891 A | 6/1991 | Lee |
| 5,107,345 A | 4/1992 | Lee |
| 5,452,104 A | 9/1995 | Lee |
| 5,504,484 A * | 4/1996 | Wilson ......................... 341/67 |
| 5,648,774 A | 7/1997 | Hsieh |
| 5,675,332 A * | 10/1997 | Limberg ...................... 341/67 |
| 5,835,033 A | 11/1998 | Mita |

FOREIGN PATENT DOCUMENTS

| | | |
|---|---|---|
| EP | 0426429 | 10/1990 |
| EP | 0535571 | 9/1992 |
| EP | 0577330 | 6/1993 |
| EP | 0616471 | 3/1994 |

* cited by examiner

*Primary Examiner*—Edward Coles
*Assistant Examiner*—Heather D. Gibbs
(74) *Attorney, Agent, or Firm*—Phil Wadsworth; Sandip (Micky) S. Minha; Abdollah Katbab

(57) ABSTRACT

An apparatus and method for minimizing the code length of an input address for at least one for variable length encoded data is claimed. A block of variable length encoded data is read. The block of variable length encoded data is then converted into sub-optimall encoded data. The variable length encoded data is defined in having a prefix portion and a suffix portion. The prefix portion of the variable length encoded data is used to signify the look-up table. The suffix portion of the variable length encoded data is used as an input address for the look-up table.

15 Claims, 3 Drawing Sheets though quality is important, it is also important that any hardware, such as the hardware for decoding the encoded images to produce the decoded images, be as compact as possible.

SUB-OPTIMAL VARIABLE LENGTH CODING

BACKGROUND

I. Field

The present invention relates to digital signal processing. More specifically, the present invention relates to minimizing the length of an input address for variable length encoded data using a sub-optimal variable length code.

II. Description of the Related Art

In the field of transmission and reception of video signals such as projecting "films" or "movies", various improvements are being made to image compression techniques. Many of the current and proposed video systems make use of digital encoding techniques. Digital encoding provides a robustness for the communications link which resists impairments such as multipath fading and jamming or signal interference, each of which could otherwise serious degrade image quality. Furthermore, digital techniques facilitate the use signal encryption techniques, which are found useful or even necessary for governmental and many newly developing commercial broadcast applications.

High definition video, such as that in digital cinema, is an area which benefits from improved image compression techniques. One compression technique capable of offering significant levels of compression while preserving the desired level of quality for video signals utilizes adaptively sized blocks and sub-blocks of encoded Discrete Cosine Transform (DCT) coefficient data. This technique will hereinafter be referred to as the Adaptive Block Size Differential Cosine Transform (ABSDCT) method.

Lossless compression refers to compression methods for which the original uncompressed data set can be recovered exactly from the compressed stream. Given an input set of symbols, a modeler generates an estimate of the probability distribution of the input symbols. The probability model is then used to map symbols into codewords. A well-known encoding technique to perform lossless compression is Huffman encoding. In Huffman encoding, modeling and symbol-to-codeword mapping functions are combined into a single process. First, the codewords or symbols are ordered according to their probabilities. For example, if there are N distinct symbols, $s_1, s_2, \ldots, s_n$ and the probabilities of occurrence are $p_1, p_2, \ldots, p_n$, then the symbols are rearranged so that $p_1 \geq p_2 \geq p_3 \ldots \geq p_n$. Generally, the frequency of each occurrence of each symbol is known or estimated apriori. Then, a contraction process is applied to the symbols with the lowest probabilities. For example, given the two symbols $s_{N-1}$ and $s_N$, the two symbols are replaced by a hypothetical symbol, $H_{N-1}$ that has a probability of occurrence $p_{N-1}+p_N$. Thus, the new set of symbols has N-1 members: $s_1, s_2, \ldots, s_{n-2}, H_{N-1}$. The process is repeated until the final set has only one member. This recursive process may be viewed as the construction of a binary tree, since at each step two symbols are being merged.

Huffman decoding is accomplished in a variety of ways, each of which has distinct disadvantages. Look-up table based decoding yields a constant decoding symbol rate. The look-up table is constructed at the decoder. For example, if the longest code word is L bits, than a $2^L$ entry look-up table is needed. From the compressed input bit stream, L bits are read into a buffer. The L bit word in the buffer is used as an address into the lookup table to obtain the corresponding symbol, say $s_K$. Let the codeword length be $l_K$. The first $l_K$ bits are discarded from the buffer and the next $l_K$ bits are input, so that the buffer again has L bits. This is repeated until all of the symbols have been decoded.

Although the Huffman coding technique described above performs remarkably well, compact hardware implementation of the technique may be difficult. An alternative technique that would make hardware implementation more efficient is desired. Further, because the number of bits of data is large, decoding may not occur in a single clock cycle. An apparatus and method that allows for compact hardware implementation arid code look-ups to occur in one clock cycle is provided by the invention in the manner described below.

SUMMARY

The apparatus and methods for minimizing the code length of an input address for at least one look-up table for variable length encoded data are disclosed. The method comprises reading a block of variable length encoded data, converting the block of variable length encoded data into sub-optimal encoded data by separating the variable length encoded data into a prefix portion and a suffix portion, using the prefix portion of the variable length encoded data to signify a particular look-up table, and using the suffix portion of the variable length encoded data as an input address for the particular look-up table. The method may further comprise retrieving data from the look-up table corresponding to the input address. In an embodiment, converting the block of variable length encoded data into sub-optimal encoded data allows for retrieving data from the look-up table corresponding to the input address to occur in a single clock cycle.

Accordingly, it is a feature and advantage of the disclosed embodiments to reduce the size of hardware look-up table.

It is another feature and advantage of the disclosed embodiments to allow a table look-up to occur in a single clock cycle.

It is another feature and advantage of the disclosed embodiments to allow a table look-up to occur in a single clock cycle without degradation in image data or image quality.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION

Figure 1:
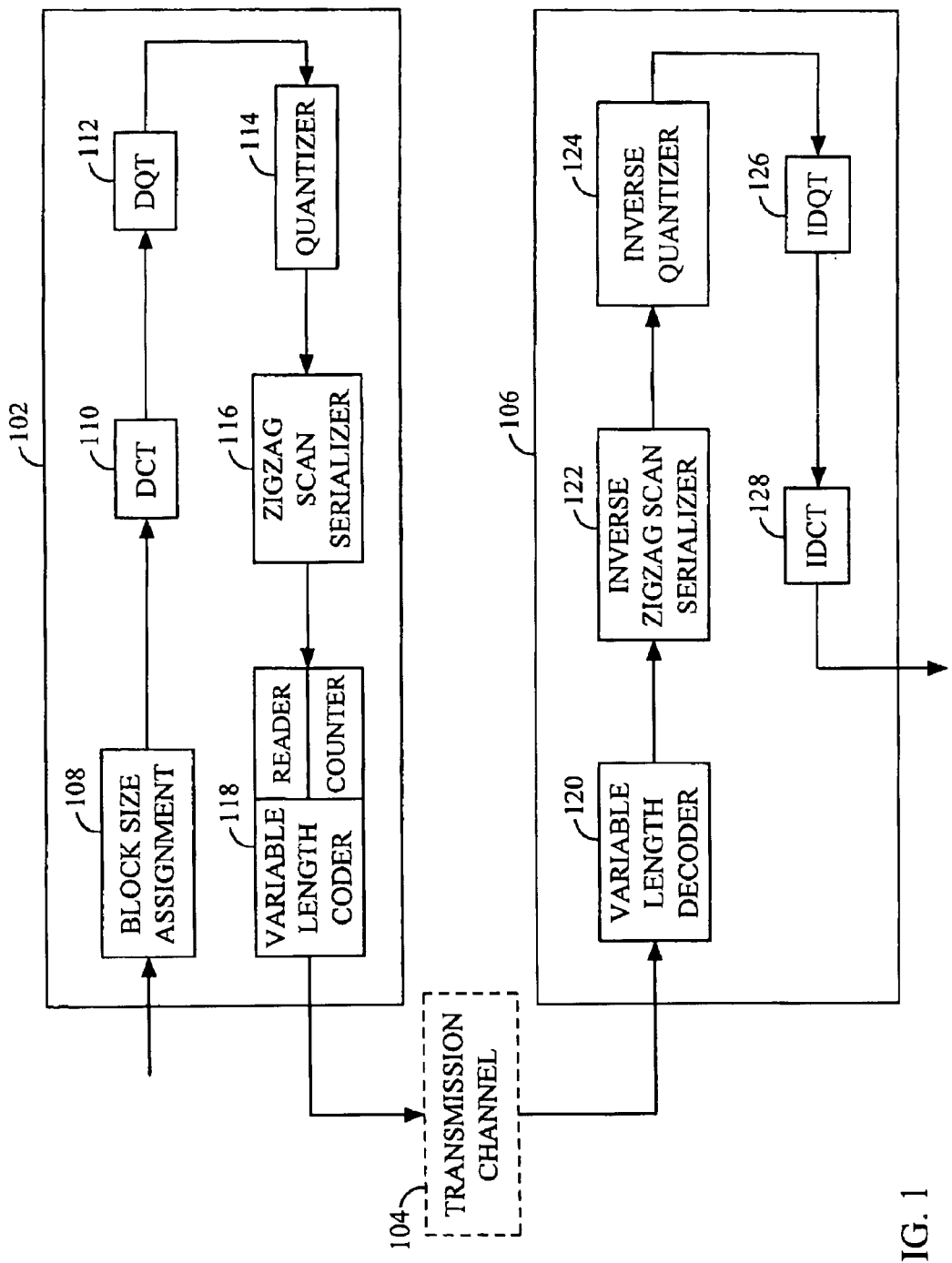
FIG. 1 is a block diagram of an image processing system that incorporates the variance based block size assignment system and method.

In order to facilitate digital transmission of digital signals and enjoy the corresponding benefits, it is generally necessary to employ some form of signal compression. To achieve high definition in a resulting image, it is also important that the high quality of the image be maintained. Furthermore, computational efficiency is sired for compact hardware implementation, which is important in many applications.

In an embodiment, image compression is based on discrete cosine transform (DCT) techniques. Generally, an image to be processed in the digital domain would be composed of pixel data divided into an array of non-overlapping blocks, N×N in size. A two-dimensional DCT may be performed on each block. The two-dimensional DCT is defined by the following relationship:

$$X(k,l) = \frac{\alpha(k)\beta(l)}{N} \sum_{m=0}^{N-1} \sum_{n=0}^{N-1} x(m,n)\cos\left[\frac{(2m+1)\pi k}{2N}\right]\cos\left[\frac{(2n+1)\pi l}{2N}\right],$$

$$0 \leq k, l \leq N-1 \text{ where } \alpha(k), \beta(k) = \begin{cases} 1, & \text{if } k = 0 \\ \sqrt{2}, & \text{if } k \neq 0, \text{ and} \end{cases}$$

x(m,n) is the pixel location (m,n) within an N×M block, and

X(k,l) is the corresponding DCT coefficient.

Since pixel values are non-negative, the DCT component X(0,0) is always positive and usually has the most energy. In fact, for typical images, most of the transform energy is concentrated around the-component X(0,0). This energy compaction property makes the DCT technique such an attractive compression method.

It has been observed that most natural images are made up of flat relatively slow varying areas, and busy areas such as object boundaries and high-contrast texture. Contrast adaptive coding schemes take advantage of this factor by assigning more bits to the busy areas and less bits to the less busy areas. This technique is disclosed in U.S. Pat. No. 5,021,891, entitled "Adaptive Block Size Image Compression Method and System," assigned to the same assignee and incorporated herein by reference. DCT techniques are also disclosed in U.S. Pat. No. 5,107,345, entitled "Adaptive Block Size Image Compression Method And System," assigned to the same assignee and incorporated herein by reference. Further, the use of the ABSDCT technique in combination with a Differential Quadtree Transform technique is discussed in U.S. Pat. No. 5,452,104, entitled "Adaptive Block Size Image Compression Method And System," also assigned to the same assignee and incorporated herein by reference. The systems disclosed in these patents utilizes what is referred to as "intra-frame" encoding, where each frame of image data is encoded without regard to the content of any other frame. Using the ABSDCT technique, the achievable data rate may be greatly without discernible degradation of the image quality.

Using ABSDCT, a video signal will generally be segmented into blocks of pixels for processing. For each block, the luminance and chrominance components are passed to a block interleaver. For example, a 16×16 (pixel) block may be presented to the block interleaver, which orders or organizes the image samples within each 16×16 block to produce blocks and composite sub-blocks of data for discrete cosine transform (DCT) analysis. The DCT operator is one method of converting a time-sampled signal to a frequency representation of the same signal. By converting to a frequency representation, the DCT techniques have been shown to allow for very high levels of compression, as quantizers can be designed to take advantage of the frequency distribution characteristics of an image. In a preferred embodiment, one 16×16 DCT is applied to a first ordering, four 8×8 DCTs are applied to a second ordering, 16 4×4 DCTs are applied to a third ordering, and 64 2×2 DCTs are applied to a fourth ordering.

For image processing purposes, the DCT operation is performed on pixel data that is divided into an array of non-overlapping blocks. Note that although block sizes are discussed herein as being N×N in size, it is envisioned that various block sizes may be used. For example, a N×M block size may be utilized where both N and M are integers with M being either greater than or less than N. Another important aspect is that the block is divisible into at least one level of sub-blocks, such as N/i×N/i, N/i×N/j, N/i×M/j, and etc. where i and j are integers. Furthermore, the exemplary block size as discussed herein is a 16×16 pixel block with corresponding block and sub-blocks of DCT coefficients. It is further envisioned that various other integers such as both even or odd integer values may be used, e.g. 9×9.

In general, an image is divided into blocks of pixels for processing. A color signal may be converted from RGB space to $YC_1C_2$ space, with Y being the luminance, or brightness, component, and $C_1$, and $C_2$ being the chrominance, or color, components. Because of the low spatial sensitivity of the eye to color, many systems sub-sample the $C_1$ and $C_2$ components by a factor of four in the horizontal and vertical directions. However, the sub-sampling is not necessary. A full resolution image, known as 4:4:4 format, may be either very useful or necessary in some applications such as those referred to as covering "digital cinema." Two possible $YC_1C_2$ representations are, the YIQ representation and the YUV representation, both of which are well known in the art. It is also possible to employ a variation of the YUV representation known as YCbCr.

Referring now to FIG. 1, an image processing system 100 which incorporates the invention is shown. The image processing system 100 comprises an encoder 102 that compresses a received video signal. The compressed signal is transmitted through a transmission channel 104, and received by a decoder 106. The decoder 106 decodes the received signal into image samples, which may then be displayed.

In one embodiment, each of the Y, Cb, and Cr components is processed without sub-sampling. Thus, an input of a 16×16 block of pixels is provided to the encoder 102. The encoder 102 comprises a block size assignment element 108, which performs block size assignment in preparation for video compression. The block size assignment element 108 determines the block decomposition of the 16×16 block based on the perceptual characteristics of the image in the block. Block size assignment subdivides each 16×16 block into smaller blocks in a quad-tree fashion depending on the activity within a 16×16 block. The block size assignment element 108 generates a quad-tree data, called the PQR data, whose length can be between 1 and 21 bits. Thus, if block size assignment determines that a 16×16 block is to be divided, the R bit of the PQR data is set and is followed by four additional bits of Q data corresponding to the four divided 8×8 blocks. If block size assignment determines that any of the 8×8 blocks is to be subdivided, then four additional bits of P data for each 8×8 block subdivided are added.

Figure 2:
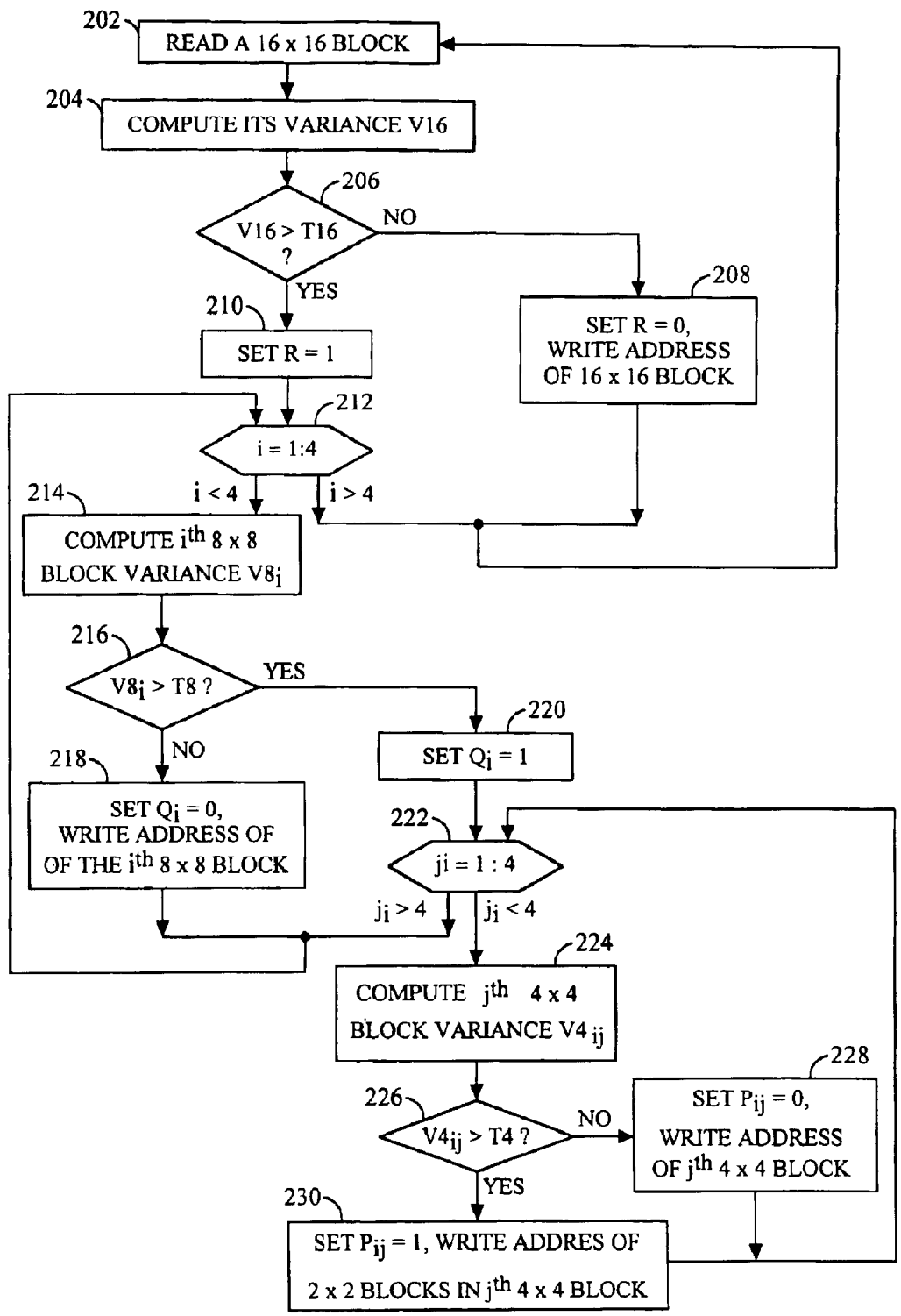
FIG. 2 is a flow diagram illustrating the processing steps involved in variance based block size assignment.

Referring now to FIG. 2, a flow diagram showing details of the operation of the block size assignment element 108 is provided. The algorithm uses the variance of a block as a metric in the decision to subdivide a block. Beginning at step 202, a 16×16 block of pixels is read. At step 204, the variance, v16, of the 16×16 block is computed. The variance is computed as follows:

$$\text{var} = \frac{1}{N^2} \sum_{i=0}^{N-1} \sum_{j=0}^{N-1} x_{i,j}^2 - \left( \frac{1}{N^2} \sum_{i=0}^{N-1} \sum_{j=0}^{N-1} x_{i,j} \right)^2$$

where N=16, and $X_{ij}$ is the pixel in the $i^{th}$ row,$j^{th}$ column within the N×N block. At step 206, first the variance threshold T16 is modified to provide a new threshold T'16 if the mean value of the block is between two predetermined values, then the block variance is compared against the new threshold, T'16.

If the variance v16 is not greater than the threshold T16, then at step 208, the starting address of the 16×16 block is written, and the R bit of the PQR data is set to 0 to indicate that the 16×16 block is not subdivided. The algorithm then reads the next 16×16 block of pixels. If the variance v16 is greater than the threshold T16, then at step 210, the R bit of the PQR data is set to 1 to indicate that the 16×16 block is to be subdivided into four 8×8 blocks.

The four 8×8 blocks, i=1:4, are considered sequentially for further subdivision, as shown in step 212. For each 8×8 block, the variance, v8$_i$, is computed, at step 214. At step 216, first the variance threshold T8 is modified to provide a new threshold T'8 if the mean value of the block is between two predetermined values, then the block variance is compared to this new threshold.

If the variance v8$_i$ is not greater than the threshold T8, then at step 218, the starting address of the 8×8 block is written, and the corresponding Q bit, Q$_i$, is set to 0. The next 8×8 block is then processed. If the variance v8$_i$ is greater than the threshold T8, then at step 220, the corresponding Q bit, Q$_i$, is set to 1 to indicate that the 8×8 block is to be subdivided into four 4×4 blocks.

The four 4×4 blocks, j$_i$=1:4, are considered sequentially for further subdivision, as shown in step 222. For each 4×4 block, the variance, v4$_{ij}$, is computed, at step 224. At step 226, first the variance threshold T4 is modified to provide a new threshold T'4 if the mean value of the block is between two predetermined values, then the block variance is compared to this new threshold.

If the variance v4$_{ij}$ is not greater than the threshold T4, then at step 228, the address of the 4×4 block is written, and the corresponding P bit, P$_{ij}$, is set to 0. The next 4×4 block is then processed. If the variance v4$_{ij}$ is greater than the threshold T4, then at step 230, the corresponding P bit, P$_{ij}$, is set to 1 to indicate that the 4×4 block is to be subdivided into four 2×2 blocks. In addition, the address of the 4 2×2 blocks are written.

The thresholds T16, T8, and T4 may be predetermined constants. This is known as the hard decision. Alternatively, an adaptive or soft decision may be implemented. The soft decision varies the thresholds for the variances depending on the mean pixel value of the 2N×2N blocks, where N can be 8, 4, or 2. Thus, functions of the mean pixel values, may be used as the thresholds.

For purposes of illustration, consider the following example. Let the predetermined variance thresholds for the Y component be 50, 1100, and 880 for the 16×16, 8×8, and 4×4 blocks, respectively. In other words, T16=50, T8=1100, and T16=880. Let the range of mean values be 80 and 100. Suppose the computed variance for the 16×16 block is 60. Since 60 and its mean value 90 is greater than T16, the 16×16 block is subdivided into four 8×8 sub-blocks. Suppose the computed variances for the 8×8 blocks are 1180, 935, 980, and 1210. Since two of the 8×8 blocks have variances that exceed T8, these two blocks are further subdivided to produce a total of eight 4×4 sub-blocks.

Finally, suppose the variances of the eight 4×4 blocks are 620, 630, 670, 610, 590, 525, 930, and 690, with the first four corresponding means values 90, 120, 110, 115. Since the mean value of the first 4×4 block falls in the range (80, 100), its threshold will be lowered to T'4=200 which is less than 880. So, this 4×4 block will be subdivided as well as the seventh 4×4 block.

Note that a similar procedure is used to assign block sizes for the color components $C_1$ and $C_2$. The color components may be decimated horizontally, vertically, or both. Additionally, note that although block size assignment has been described as a top down approach, in which the largest block (16×16 in the present example) is evaluated first, a bottom up approach may instead be used. The bottom up approach will evaluate the smallest blocks (2×2 in the present example) first.

Referring back to FIG. 1, the remainder of the image processing system 110 will be described. The PQR data, along with the addresses of the selected blocks, are provided to a DCT element 110. The DCT element 110 uses the PQR data to perform discrete cosine transforms of the appropriate sizes on the selected blocks. Only the selected blocks need to undergo DCT processing.

The image processing system 100 may optionally comprise DQT element 112 for reducing the redundancy among the DC coefficients of the DCTs. A DC coefficient is encountered at the top left corner of each DCT block. The DC coefficients are, in general, large compared to the AC coefficients. The discrepancy in sizes makes it difficult to design an efficient variable length coder. Accordingly, it is advantageous to reduce the redundancy among the DC coefficients.

The DQT element 112 performs 2-D DCTs on the DC coefficients, taken 2×2 at a time. Starting with 2×2 blocks within 4×4 blocks, a 2-D DCT is performed on the four DC coefficients. This 2×2 DCT is called the differential quadtree transform, or DQT, of the four DC coefficients. Next, the DC coefficient of the DQT along with the three neighboring DC coefficients with an 8×8 block are used to compute the next level DQT. Finally, the DC coefficients of the four 8×8 blocks within a 16×16 block are used to compute the DQT. Thus, in a 16×16 block, there is one true DC coefficient and the rest are AC coefficients corresponding to the DCT and DQT.

The transform coefficients (both DCT and DQT) are provided to a quantizer 114 for quantization. In a preferred embodiment, the DCT coefficients are quantized using frequency weighting masks (FWMs) and a quantization scale factor. A FWM is a table of frequency weights of the same dimensions as the block of input DCT coefficients. The frequency weights apply different weights to the different DCT coefficients. The weights are designed to emphasize the input samples having frequency content that the human visual system is more sensitive to, and to de-emphasize samples having frequency content that the visual system is less sensitive to. The weights may also be designed based on factors such as viewing distances, etc.

Huffman codes are designed from either the measured or theoretical statistics of an image. It has been observed that most natural images are made up of blank or relatively slowly varying areas, and busy areas such as object boundaries and high-contrast texture. Huffman coders with frequency-domain transforms such as the DCT exploit these features by assigning more bits to the busy areas and fewer bits to the blank areas. In general, Huffman coders make use of look-up tables to code the run-length and the non-zero values.

The weights are selected based on empirical data. A method for designing the weighting masks for 8×8 DCT coefficients is disclosed in ISO/IEC JTC1 CD 10918, "Digital compression and encoding of continuous-tone still images—part 1: Requirements and guidelines," International Standards Organization, 1994, which is herein incorporated by reference. In general, two FWMs are designed, one for the luminance component and one for the chrominance components. The FWM tables for block sizes 2×2, 4×4 are obtained by decimation and 16×16 by interpolation of that for the 8×8 block. The scale factor controls the quality and bit rate of the quantized coefficients.

$$DCT_q(i, j) = \left\lfloor \frac{8*DCT(i, j)}{fwm(i, j)*q} \pm \frac{1}{2} \right\rfloor$$

where DCT(ij) is the input DCT coefficient, fwm(i,j) is the frequency weighting mask, q is the scale factor, and DCTq (i,j) is the quantized coefficient. Note that depending on the sign of the DCT coefficient, the first term inside the braces is rounded up or down. The DQT coefficients are also quantized using a suitable weighting mask. However, multiple tables or masks can be used, and applied to each of the Y, Cb, and Cr components.

The quantized coefficients are provided to a zigzag scan serializer 116. The serializer 116 scans the blocks of quantized coefficients in a zigzag fashion to produce a serialized stream of quantized coefficients. A number of different zigzag scanning patterns, as well as patterns other than zigzag may also be chosen. A preferred technique employs 8×8 block sizes for the zigzag scanning, although other sizes may be employed.

Note that the zigzag scan serializer 116 may be placed either before or after the quantizer 114. The net results are the same.

In any case, the stream of quantized coefficients is provided to a variable length coder 118. The variable length coder 118 may make use of run-length encoding of zeros followed by encoding. This technique is discussed in detail in aforementioned U.S. Pat. Nos. 5,021,891, 5,107,345, and 5,452,104, and is summarized herein. A run-length coder takes the quantized coefficients and notes the run of successive coefficients from the non-successive coefficients. The successive values are referred to as run-length values, and are encoded. The non-successive values are separately encoded. In an embodiment, the successive coefficients are zero values, and the non-successive coefficients are non-zero values. Typically, the run length is from 0 to 63 bits, and the size is an AC value from 1–10. An end of file code adds an additional bit—thus, there is a total of 641 possible codes.

Figure 3:
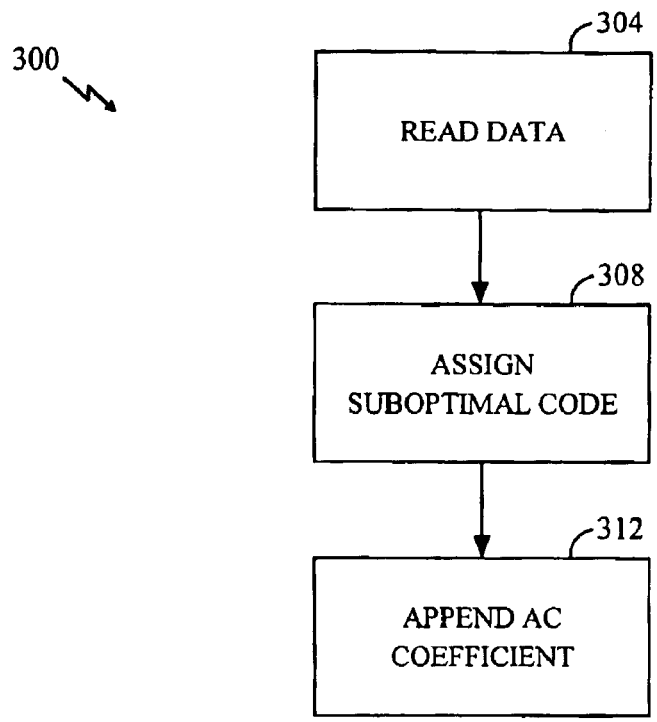
FIG. 3 is a flow diagram illustrating the processing steps involved in encoding data using a sub-optimal encoding technique.

A modified Huffman coding of the quantized coefficients is also possible and is used in one embodiment. FIG. 3 illustrates such a process 300. Such a process is needed because of size and capacity restraints. For example, if optimal Huffman codes were used, the look-up table needs a capacity of about $2^{21}$ (2,097,152) entries. Such a voluminous table is difficult to implement in hardware because of its size. Further, even if implemented, retrieving data in such a large table is difficult in the desired clock speed. In an embodiment, a clock speed of 74.25 MHz is used, although it is contemplated that other clock speeds may be used. 74.25 MHz is the clock speed as dictated by SMPTE (Society of Motion Picture and Television Engineers) Standard 274 M. Use of a sub-optimal coding scheme, however, may reduce the size to about $2^{18}$ (262,144) entries.

In FIG. 3, after zigzag scanning, a run-length coder determines the run-length/size pairs within a block. In one embodiment, 8×8 blocks are used, although it is contemplated that any block size may be implemented. These run-length/size pairs are then Huffman encoded. A block of data is read by a reader (304), the data comprising a run length and size. The run length indicates a number of successive values of the same magnitude, and the size indicates the number of AC bits in the non-successive portion. Based on probabilities of occurrence, the data comprising run length and size is converted by a converter to sub-optimal data (308). The sub-optimal data inherently comprises a prefix portion of a given value that is indicative of a particular look-up table. Sub-optimal Huffman codes are generated and assigned in a correlation such that the shortest lengths are given to the most common codes (that is, the most common run lengths and size pairs). The sub-optimal codes are uniquely decodable such that the look-up process in the decoder 106 is simplified. There may be any number of given prefix portion combinations of values. The number of prefix values may be correlated to the number of look-up tables. In one embodiment, there are three prefix portions correlated to three look-up tables, each having about $2^9$ (512) entries. After a prefix and suffix portion is assigned, the actual AC coefficient portion is appended (312). The AC coefficient is generally represented by a size number.

For example, given a run length of 16 and a size of 5, the optimal Huffman code is a 15 bit symbol "011110111111010". In the present invention, the symbol for a run length of 16 and a size of 5 is a sub-optimal 18 bits in length, being "111111110000000000". In this case, the prefix portion is the first 9 bits (111111110), and the suffix portion is the last 9 bits (000000000). In other cases, the number of bits representing the prefix portion or the suffix portion may vary. The AC coefficient is then appended. The AC coefficient is represented by the size number of bits.

The compressed image signal generated by the encoder 102 is transmitted to the decoder 106 via the transmission channel 104. The PQR data, which contains the block size assignment information, is also provided to the decoder 106. The decoder 106 comprises a variable length decoder 120, which decodes the run-length values and the non-zero values.

Figure 4:
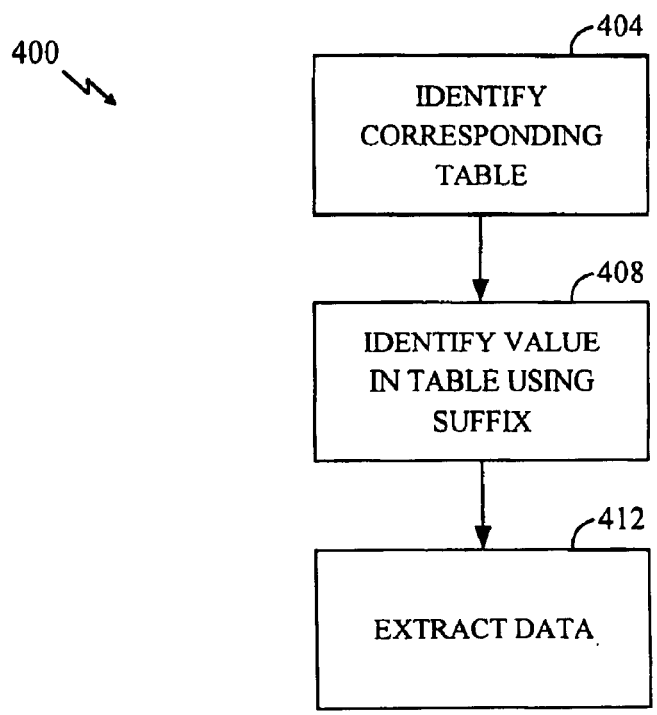
FIG. 4 illustrates a flow diagram illustrating the processing steps involved in decoding

FIG. 4 illustrates operation of the variable length decoder 120 in relation to the process of converting the sub-optimal, compressed image data into run length and size data 400. Data is read in and the prefix portion corresponding to a particular table is identified (404). In the example above, the prefix portion is the first 9 bits (111111110). Once a particular table, or portion of a table, is identified, a suffix portion of the data is used as a look-up value in the table (408). In the example above, the suffix portion is the last 9 bits (000000000). The table produces a corresponding run length and size, the size dictating the number of AC bits following (412).

Referring back to FIG. 1, the output of the variable length decoder 120 is provided to an inverse zigzag scan serializer 122 that orders the coefficients according to the scan scheme employed. The inverse zigzag scan serializer 122 receives the PQR data to assist in proper ordering of the coefficients into a composite coefficient block.

The composite block is provided to an inverse quantizer 124, for undoing the processing due to the use of the frequency weighting masks.

The coefficient block is then provided to an IDQT element 126, followed by an IDCT element 128, if the Differential Quad-tree transform had been applied. Otherwise, the coefficient block is provided directly to the IDCT element 128. The IDQT element 126 and the IDCT element 128 inverse transform the coefficients to produce a block of pixel data. The pixel data may be then have to be interpolated, converted to RGB form, and then stored for future display.

The previous description of the disclosed embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A method for minimizing a code length of an input address for at least one look-up table for variable length encoded data, the method comprising:

reading a block of variable length encoded data;

converting the block of variable length encoded data into sub-optimal encoded data, the variable length encoded data having a prefix portion and a suffix portion;

using the prefix portion of the variable length encoded data to signify the look-up table;

using the suffix portion of the variable length encoded data as an input address for the look-up table; and retrieving data from the look-up table corresponding to the input address, wherein converting the block of variable length encoded data into sub-optimal encoded data allows for retrieving data from the look-up table corresponding to the input address to occur in one clock cycle.

2. The method as set forth in claim 1, wherein a clock cycle is 74.25 MHz.

3. A method for minimizing the code length of an input address for at least one look-up table for variable length encoded data, the method comprising:

reading a block of variable length encoded data;

converting the block of variable length encoded data into sub-optimal encoded data, the variable length encoded data having a prefix portion and a suffix portion;

using the prefix portion of the variable length encoded data to signify the look-up table; and using the suffix portion of the variable length encoded data as an input address for the look-up table, wherein there are three look-up tables, wherein the three look-up table each comprises about $2^9$ (512) entries.

4. A method for minimizing a code length of an input address for at least one look-up table for variable length encoded data, the method comprising:

reading a block of variable length encoded data;

converting the block of variable length encoded data into sub-optimal encoded data, the variable length encoded data having a prefix portion and a suffix portion;

using the prefix portion of the variable length encoded data to signify the look-up table; and using the suffix portion of the variable length encoded data as an input address for the look-up table, wherein the variable length encoded data comprises a run length portion and a size portion, wherein the run length portion indicates a number of contiguous coefficients and the size portion indicates an AC value of the coefficients.

5. A method for minimizing a code length of an input address for at least one look-up table for variable length encoded data, the method comprising:

reading a block of variable length encoded data;

converting the block of variable length encoded data into sub-optimal encoded data, the variable length encoded data having a prefix portion and a suffix portion;

using the prefix portion of the variable length encoded data to signify the look-up table; and using the suffix portion of the variable length encoded data as an input address for the look-up table, wherein converting the block of variable length encoded data into sub-optimal encoded data is done such that the length of the variable length encoded data that occurs most frequently is correlated to the code length.

6. An apparatus for minimizing a code length of an input address for at least one look-up table for variable length encoded data, the method comprising:

a reader configured to read a block of variable length encoded data; and a converter configured to convert the block of variable length encoded data into sub-optimal encoded data, the converter separating the variable length encoded data into a prefix portion and a suffix portion, wherein the prefix portion of the variable length encoded data is configured to signify a particular look-up table, and wherein the suffix portion of the variable length encoded data is configured as an input address for the particular look-up table.

wherein the converter is configured to convert the block of variable length encoded data into sub-optimal encoded data such that data may be retrieved from the look-up table corresponding to the input address in one clock cycle.

7. The apparatus as set forth in claim 6, wherein the clock cycle is 74.25 MHz.

8. An apparatus for minimizing the code length of an input address for at least one look-up table for variable length encoded data, the method comprising:

a reader configured to read a block of variable length encoded data; and a converter configured to convert the block of variable length encoded data into sub-optimal encoded data, the converter separating the variable length encoded data into a prefix portion and a suffix portion, wherein the prefix portion of the variable length encoded data is configured to signify a particular look-up table, and wherein the suffix portion of the variable length encoded data is configured as an input address for the particular look-up table, wherein there are three look-up tables, wherein the three look-up table each comprises about $2^9$ (512) entries.

9. An apparatus for minimizing the code length of an input address for at least one look-up table for variable length encoded data, the method comprising:

a reader configured to read a block of variable length encoded data; and a converter configured to convert the block of variable length encoded data into sub-optimal encoded data, the converter separating the variable length encoded data into a prefix portion and a suffix portion, wherein the prefix portion of the variable length encoded data is configured to signify a particular look-up table, and wherein the suffix portion of the variable length encoded data is configured as an input address for the particular look-up table, wherein the variable length encoded data comprises a run length portion and a size portion, wherein the run length portion indicates a number of contiguous coefficients and the size portion indicates an AC value of the coefficients.

10. An apparatus for minimizing the code length of an input address for at least one look-up table for variable length encoded data, the method comprising:

a reader configured to read a block of variable length encoded data; and a converter configured to convert the block of variable length encoded data into sub-optimal encoded data, the converter separating the variable length encoded data into a prefix portion and a suffix portion, wherein the prefix portion of the variable length encoded data is configured to signify a particular look-up table, and wherein the suffix portion of the variable length encoded data is configured as an input address for the particular look-up table, wherein the converter is configured such that the length of the variable length encoded data that occurs most frequently is correlated to the code length.

11. An apparatus for minimizing the code length of an input address for at least one look-up table for variable length encoded data, the method comprising:

means for reading a block of variable length encoded data; and means for converting the block of variable length encoded data into sub-optimal encoded data, the means for converting comprising means for separating the variable length encoded data into a prefix portion and a suffix portion, wherein the prefix portion of the variable length encoded data is configured to signify a particular look-up table, and wherein the suffix portion of the variable length encoded data is configured as an input address for the particular look-up table, wherein the means for converting is configured to convert the block of variable length encoded data into sub-optimal encoded data such that data may be retrieved from the look-up table corresponding to the input address in one clock cycle.

12. The apparatus as set forth in claim 11, wherein the clock cycle is 74.25 MHz.

13. An apparatus for minimizing the code length of an input address for at least one look-up table for variable length encoded data, the method comprising:

means for reading a block of variable length encoded data; and means for converting the block of variable length encoded data into sub-optimal encoded data, the means for converting comprising means for separating the variable length encoded data into a prefix portion and a suffix portion, wherein the prefix portion of the variable length encoded data is configured to signify a particular look-up table, and wherein the suffix portion of the variable length encoded data is configured as an input address for the particular look-up table, wherein there are three look-up tables, wherein the three look-up table each comprises about $2^9$ (512) entries.

14. An apparatus for minimizing the code length of an input address for at least one look-up table for variable length encoded data, the method comprising:

means for reading a block of variable length encoded data; and means for converting the block of variable length encoded data into sub-optimal encoded data, the means for converting comprising means for separating the variable length encoded data into a prefix portion and a suffix portion, wherein the prefix portion of the variable length encoded data is configured to signify a particular look-up table, and wherein the suffix portion of the variable length encoded data is configured as an input address for the particular look-up table, wherein the variable length encoded data comprises a run length portion and a size portion, wherein the run length portion indicates a number of contiguous coefficients and the size portion indicates an AC value of the coefficients.

15. An apparatus for minimizing the code length of an input address for at least one look-up table for variable length encoded data, the method comprising:

means for reading a block of variable length encoded data; and means for converting the block of variable length encoded data into sub-optimal encoded data, the means for converting comprising means for separating the variable length encoded data into a prefix portion and a suffix portion, wherein the prefix portion of the variable length encoded data is configured to signify a particular look-up table, and wherein the suffix portion of the variable length encoded data is configured as an input address for the particular look-up table, wherein the means for converting is configured such that the length of the variable length encoded data that occurs most frequently is correlated to the code length.

* * * * *